United States Patent [19]

Gurary et al.

[11] Patent Number: 5,759,281
[45] Date of Patent: Jun. 2, 1998

[54] CVD REACTOR FOR UNIFORM HEATING WITH RADIANT HEATING FILAMENTS

[75] Inventors: Alexander I. Gurary, Bridgewater; Scott Beherrell, Phillipsburg; Vadim Boguslavskiy, Somerville, all of N.J.

[73] Assignee: Emcore Corporation, Somerset, N.J.

[21] Appl. No.: 885,711

[22] Filed: Jun. 30, 1997

[51] Int. Cl.⁶ .................................................. C23C 16/00
[52] U.S. Cl. .................................. 118/725; 118/730
[58] Field of Search ........................... 118/725, 730

Primary Examiner—Richard Bueker
Attorney, Agent, or Firm—Lerner, David, Littenberg, Krumholz & Mentlik

[57] ABSTRACT

Apparatus for the growth of epitaxial layers is disclosed. The apparatus includes a wafer carrier mounted within a growth chamber, a reactant inlet for introducing a reactant into the chamber, and a heating element mounted within the chamber for heating wafers mounted on the wafer carrier. The heating element is mounted in a manner which permits unrestricted thermal expansion of the heating element therein.

29 Claims, 2 Drawing Sheets

CVD REACTOR FOR UNIFORM HEATING WITH RADIANT HEATING FILAMENTS

FIELD OF THE INVENTION

The present invention relates to apparatus for growing epitaxial layers on wafers. More particularly, the present invention relates to apparatus for growing such epitaxial layers in connection with chemical vapor deposition (CVD) processes for the processing of substrates such as semiconductor wafers. Still more particularly, the present invention relates to such apparatus for growing epitaxial layers which comprise oxide films and in which the apparatus operates at elevated temperatures.

BACKGROUND OF THE INVENTION

In general, in connection with the processing of semiconductor wafers by means of chemical vapor deposition (CVD) and like processes, various wafer substrates such as silicon wafers and the like, are generally heated within various temperature ranges which are designed to apply to specific thin film depositions or etching operations thereon. However, in connection with the processing of epitaxial oxide materials, such as superconductor thin films (e.g., $YBa_2Cu_3O_7$), high dielectric thin films (e.g., $Ba_{1-x}Sr_xTiO_3$) and ferroelectric thin films (e.g., $SrBi_2(Ta_{1-x}Nb_x)_2O_9$), with high electro-optical coefficients have become of consideration interest in connection with the production of certain types of products, such as high-density capacitors integrated on dynamic random access memories (DRAM), microwave integrated circuits and the like. However, when CVD reactors need to be designed for the deposition of such oxide films, they generally are required to operate within considerably elevated temperature ranges, such as between about 600° C. and 800° C., and even higher. This, in turn, has created certain difficulties in connection with the design of these reactors. That is, conventional CVD reactors employ materials of construction such as graphite, molybdenum, tungsten, tantalum, and the like. These materials, however, will generally begin to oxidize at temperatures above about 300° C. to 400° C. of course, the oxidation of these materials itself can create problems within the reactor. For example, if these materials are used in connection with resistance heating or the like, oxidation can cause variations and/or interruptions in the current flow, and thus result in uneven or inconsistent heating of the semiconductor wafers within the reactor. The most significant need in these reactors, however, is to produce the uniform heating of each semiconductor, both within a single reactor use and more importantly as the reactor undergoes continued use from these processes.

Attempts have been made to apply different coatings to these materials to, therefore, protect them in these high-temperature environments. In addition, small cracks can be generated in these materials during the frequent thermal temperature cycling which is required by the very nature of these processes. The existence of these factors has limited the number of specific possibilities for selection of materials of construction for these particular CVD reactors. One such material comprises various ceramic materials, but ceramics are quite expensive and difficult to manufacture, and, in fact, are not always available in the particular geometric shape or type which is necessary for a particular reactor. Furthermore, these ceramic materials are difficult to handle and relatively easy to damage or destroy. Thus, the use of ceramics as a material of construction for these CVD reactors has been limited to the use of ceramics for relatively small parts having simple shapes.

One specific apparatus for treating semiconductor wafers is disclosed in Ohkase et al., U.S. Pat. No. 5,536,918. In this patent, there is shown a flat heat source 2 which can either be affixed to the heat retention material 4 or arranged below the processing surface 11 for semiconductor wafers. The specification of this patent discloses that the heating source 2 can comprise a plurality of ring-shaped heating units 21a–e which can be configured from a superalloy such as Kanthal.

Mahawili, U.S. Pat. No. 5,059,770, discloses heater assemblies with a plurality of heating zones, such as those shown in FIG. 3 thereof. The heating segments 22a–c are separated by gaps to provide radial spacing between the segments and electrode pairs 40a–c extending upwardly through the support base and heater base therefor. In this case, the heater element is said to be electrically conductive material, such as a metal deposited directly on the heater base 20, which is formed of a suitable dielectric material. The heater elements are said to be formed from pyrolytic graphite for the high temperatures utilized therein.

Gilbert et al., U.S. Pat. No. 5,343,022, discusses dealing with the potential oxidation problem in these types of reactors by employing pyrolytic boron nitride heating units. In particular, this patent discusses protection of electrical contact areas from oxidation by employing a contact assembly which employs graphite posts and screws for the heating element 14 thereof.

The search has, therefore, continued for improved reactors for growing epitaxial layers, particularly in connection with epitaxial oxide materials such as those discussed above.

SUMMARY OF THE INVENTION

In accordance with the present invention, these and other objects have now been realized by the discovery of apparatus for the growth of epitaxial layers on a wafer comprising a chamber, a wafer carrier mounted within the chamber for mounting at least one of the wafers thereon, a reactant inlet for introducing a reactant for the epitaxial layer into the chamber, and heating means mounted within the chamber in juxtaposition with the wafer carrier for heating the wafer to a predetermined temperature for growing the epitaxial layer thereon, the heating means comprising at least one radiant heating element mounted with respect to the wafer carrier in a manner which permits unrestricted thermal expansion of the radiant heating elements.

In accordance with one embodiment of the apparatus of the present invention, the apparatus includes at least one electrode bonded to the at least one radiant heating element at a first location therein, wherein substantially the entire radiant heating element apart from the first location is free of any rigid attachment to a immovable surface which could prevent the thermal expansion thereof.

In accordance with a preferred embodiment of the apparatus of the present invention, the radiant heating element comprises a superalloy. Preferably, the superalloy is selected from the group consisting of nickel- and iron-based superalloy compositions.

In accordance with another embodiment of the apparatus of the present invention, the wafer carrier comprises a rotatable disk mounted for rotation in a horizontal plane within a chamber. Preferably, the radiant heating element is mounted adjacent to the rotatable disk in a plane parallel to the horizontal plane thereof. In a preferred embodiment, the radiant heating element comprises a circular filament in the plane, most preferably an interrupted circular configuration comprising a first end and a second end defining an interruption therebetween. In another embodiment, the first and second ends of the interrupted circular configuration are permanently attached to electrodes for electrically connecting the radiant heating filament to a power source. Preferably, the electrodes extend outside of the chamber, and the apparatus includes a detachable electrical connector for detachably connecting the electrodes to the power source outside of the chamber.

In accordance with another embodiment of the apparatus of the present invention, the heating means comprises a plurality of the radiant heating elements. Preferably, the wafer carrier comprises a rotatable disk mounted for rotation in a horizontal plane within the chamber, and the plurality of radiant heating elements are mounted adjacent to the rotatable disk at a plane parallel to the horizontal plane thereof. Preferably, the plurality of radiant heating elements comprise circular filaments in the plane, and preferably interrupted circular configurations comprising a first end and a second end defining the interruption therebetween. In a most preferred embodiment, the first and second ends of the interrupted circular configurations are permanently attached to electrodes for electrically connecting the plurality of radiant heating filaments to a power source, and the electrodes preferably extend outside of the chamber. Preferably, the apparatus includes detachable electrical connectors for detachably connecting the electrodes to the power source outside of the chamber itself.

In accordance with another embodiment of the present invention, the radiant heating element comprises a metal having a coefficient of linear thermal expansion greater than about $10 \times 10^{-6}$ (IOE-6) and preferably greater than about $15 \times 10^{-6}$ (15E-6).

In accordance with another embodiment of the apparatus of the present invention, the apparatus for the growth of epitaxial layers on a wafer comprises a chamber, a wafer carrier mounted within the chamber for mounting at least one of the wafers thereon, a reactant inlet for introducing a reactant for the epitaxial layer into the chamber, and heating means mounted within the chamber and in juxtaposition with the wafer carrier for heating the wafer to a predetermined temperature for growing the epitaxial layer thereon, the heating means comprising at least one radiant heating element mounted with respect to the wafer carrier, the radiant heating element including electrical connection means permanently affixed to the radiant heating element and extending outside of the chamber for connecting the radiant heating element to a power source, whereby the chamber is free of any removable electrical connections to the radiant heating elements.

In accordance with one embodiment of the apparatus of the present invention, the electrical connection means comprises at least one electrode.

In accordance with another embodiment of this apparatus of the present invention, the radiant heating filament and the electrical connection means comprise a superalloy. Preferably, the superalloy is selected from the group consisting of nickel- and iron-based superalloy compositions.

In accordance with another embodiment of the apparatus of the present invention, the wafer carrier comprises a rotatable disk mounted for rotation in a horizontal plane within a chamber. Preferably, the radiant heating element is mounted adjacent to the rotatable disk in a plane parallel to the horizontal plane thereof. In a preferred embodiment, the radiant heating element comprises a circular filament in that plane, and preferably the radiant heating filament comprises an interrupted circular configuration comprising a first end and a second end defining the interruption therebetween.

In accordance with another embodiment of the apparatus of the present invention, the heating means comprises a plurality of the radiant heating elements.

BRIEF DESCRIPTION OF THE DRAWINGS

The present invention may be more fully appreciated with reference to the following detailed description, which, in turn, refers to the drawings in which.

DETAILED DESCRIPTION

Figure 1:
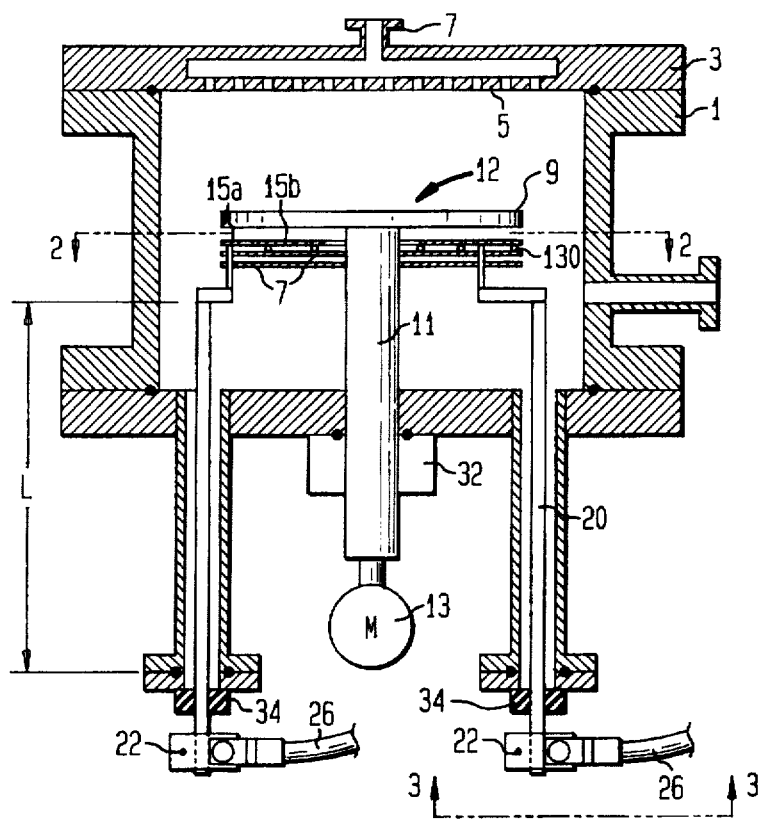
FIG. 1 is a side, elevational, sectional view of a reactor in accordance with the present invention.

A solution to the problems created by high-temperature oxidating conditions in certain CVD reactors relates to the use of superalloys as the material of construction for the heating elements, such as heating filaments used therein. However, the use of these superalloy materials themselves creates additional problems. For example, for typical superalloy materials, which can be used in this invention, the ratio between the working and melting temperatures thus defining the mechanical properties of these superalloys, including strength, creep, and the like, is much higher than is the case for materials which have conventionally been used as reactor materials, such as graphite, molybdenum and tungsten. Thus, that ratio for superalloys is usually about 60%, while for compounds such as molybdenum and graphite, for example, that ratio ranges from 20% to about 30%.

In addition, the coefficient of linear thermal expansion for these superalloys is far higher, approximately by a factor of about three, for the superalloys than it is for these conventional reactor materials, thus resulting in far higher thermal stress for the superalloy materials.

In addition, the high-temperature properties of these superalloys, when used in the presence of oxidative materials at these elevated temperatures, will result in the generation of thin oxide layers on the surface thereof. These oxide layers have a much lower electrical resistance than the superalloys themselves and can thus result in alteration of the resistance between the filament and the electrode, for example. In the case of extremely low filament resistance, most if not all of the power will thus be generated at the contact between the filament and the electrode instead of in the filament itself.

The specific properties of superalloys useful in accordance with the present invention as compared to materials conventionally used in CVD reactors is set forth in TABLE 1 below.

TABLE 1

| | | Conventional Materials | | | Superalloys | | |
|---|---|---|---|---|---|---|---|
| | | | | | Kanthal | Haynes | Inconell |
| Properties | Unit | Graphite | Mo | W | Alloy AF | Alloy 230 | Alloy 601 |
| CTE* | 1/C | (5–8)E-6 | 4.9E-6 | 4.3E-6 | 15E-6 | 18.6E-6 | 16.4E-6 |
| melting point | C | 3700 (subl.) | 2610 | 3410 | 1500 | 1400 | 1354 |
| Tprocess/ Tmelting (Tprocess = 850° C.) | % | 23 | 32 | 25 | 57 | 60 | 63 |
| Nominal composition | | | | | Cr - 22.0% Al - 5.0% Fe - 73.0% Ni - 0% | Cr - 16.0% Al - 5.0% Fe - 3.0% Ni - 75.0% | Cr - 23.0% Al - 1.4% Fe - 15.0% Ni - 60.0% |

By mounting the radiant heating filaments of the present invention adjacent to the wafer carrier in a manner which permits unrestricted thermal expansion of the heating element, any potential bending or warping of the filament due to increased thermal expansion can be avoided. Thus, the high thermal stress and low mechanical strength of these filaments does not create the problem which would have been anticipated under these conditions. Furthermore, utilizing a radiant heating filament of this type which is directly connected to electrical connection means such as electrodes which are permanently affixed thereto within the reactor, and which extend outside the reaction chamber for ultimate connection to a power source, such as by the use of a removable electrical connector outside the reaction chamber itself, the potential nonstable resistance of the heating elements because of surface oxidation resulting in changes in the contact resistance can also be avoided.

A specific preferred embodiment of the present invention is shown in the Figures and will now be discussed in more detail. Referring, for example, to FIG. 1, a typical CVD reactor 1 is schematically shown therein. The reactor 1 is generally cylindrical in shape, and includes a top flange 3 for entry into the reactor. Associated with the top flange 3 is a manifold arrangement of some type 5 for handling various gases to be utilized as reactants for producing epitaxial layers within the reactor 1. The gases thus enter the manifold through reactant inlet 7 for distribution to manifold 5 and application onto wafers within the reactor 1.

In addition, the inlets shown in FIG. 1, or other inlets into the manifold 5, can be used for applying carrier gases and other inert gases for application along with these reactant gases within the reactor chamber 1. Within the reactor chamber 1 itself, there is mounted a rotating susceptor 9 which is mounted on a central spindle 11 rotated by a motor 13. The spindle 11 is sealed using a high vacuum rotary feedthrough 32, which is commercially available and is usually of the ferrofluidic type. The rotating susceptor is located essentially in a horizontal plane within the reactor 1 so that wafers can be mounted on the top of the rotating susceptor 9 in or parallel to that plane. Thus, the gases exiting from manifold 5 in a downward direction as seen in FIG. 1 can impinge directly onto the surface of the wafers mounted on the susceptor 9 to grow epitaxial layers as required thereon. The upper surface 12 of the susceptor 9 can include means for carrying one or more wafers thereon. This can include indentations, or separate wafer carriers mounted on the top of the susceptor 9 for effecting such rotation, and for maintaining the wafers in a predetermined position thereon during same. The spindle 11 is sealably contained within the reactor so that desirable low pressure conditions can be maintained within the reactor.

In order to heat these wafers to effect such epitaxial growth, a pair of radiant heating elements 15a and 15b are shown in FIG. 1. In this case, the radiant heating elements 15a and 15b are disposed below the rotatable susceptor 9 and generally in the same plane as is the upper surface 12 of the susceptor 9. Each of these heating elements 15a and 15b is shown in an upper view in FIG. 2 hereof. Details of these heating elements will be discussed in more detail below.

In general, heat shields 7 are mounted below the radiant heating elements themselves in order to contain the heat generated therein at the locations, namely for heating the wafers on the susceptor 9.

Figure 2:
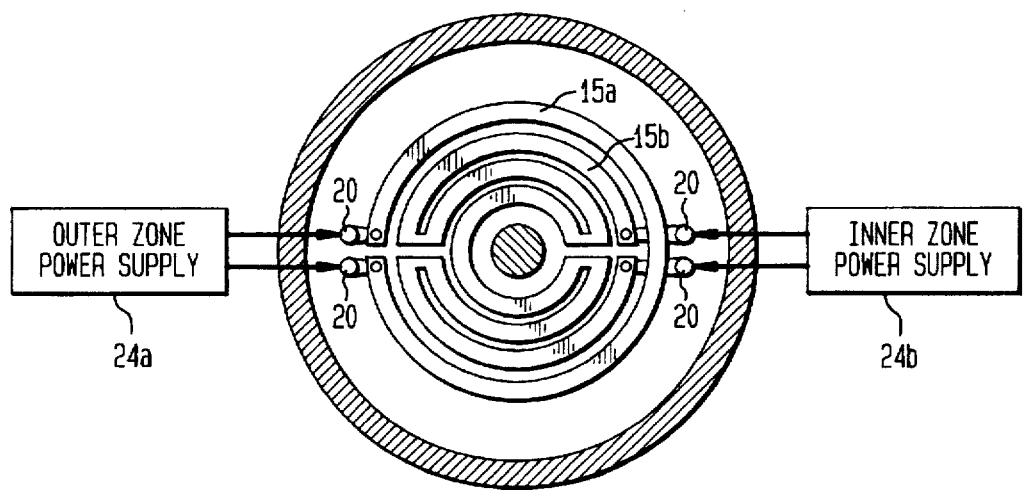
FIG. 2 is a top, elevational view of the reactor shown in FIG. 1 taken along line A—A thereof.

The specific arrangement for the radiant heating elements 15a and 15b shown in FIG. 2 includes a two-zone heating system. This is intended to provide the necessary uniform wafer temperature, which usually must be controlled within about ±1° C. in order to ensure the deposition of high-quality epitaxial films therein. In the arrangement shown in FIG. 2, there is included a two-zone heating system with an outer filament 15a connected to an outer zone power supply 24a and an inner film in 15b connected to an inner zone power supply 24b. Independent control of these inner and outer filaments permits one to compensate for the significant heat flow which occurs from the susceptor 9 to the colder reactor walls 1, and therefore to provide for the necessary uniform wafer temperature therein.

As can also be seen in FIG. 1, the heating filaments 15a and 15b are supported on the heat shield 7 by means of a number of support elements 30. These support elements are produced from a high-temperature insulated ceramic such as alumina (Al$_2$O$_3$) or zirconia. They are thus installed between the heating elements 15a and 15b and the heat shield 7, which are generally far thicker than the filaments of the heating elements 15a and 15b and have much lower temperatures than these filaments.

The heating filaments themselves, such as those shown in FIG. 2, are directly and permanently connected to electrodes 20 which then extend sealingly outside of the reactor 1. Thus, the connections between the filament and the external end of the electrodes 20 extending outside of the reactor chamber 1 are continuous and permanent, and can be a single, continuous element, or can be prepared by welding together or some other means of creating a permanent bond between any individual electrode portions in order to form single continuous electrode-filament arrangements. The elimination of any detachable electrical connections within the reaction chamber in this manner, in turn, thus eliminates the problems created by potential oxidation of the detachable electrode sections.

Figure 4:
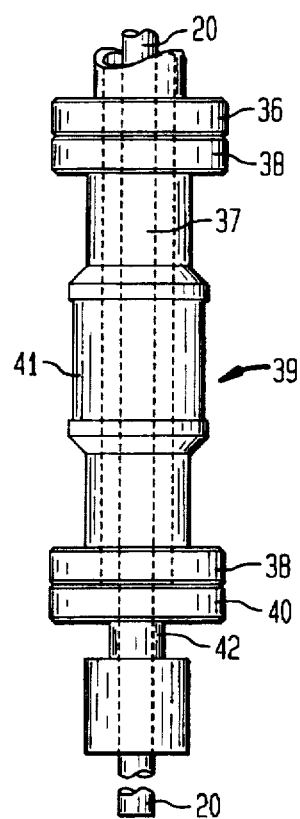
FIG. 4 is a side, elevational view of a high vacuum electrode seal for use in the present invention.

The electrodes 20 themselves are sealed with respect to the reactor using high-vacuum seals 34 as seen in FIG. 1. These seals 34 can be produced from commercially available components, as particularly shown in FIG. 4 hereof. In this case, the high vacuum seal 34 for the electrode 20 comprises a high vacuum flange 36 which is part of the reactor 1 itself. A hollow electrical insulator element 39 consists of two high vacuum flanges 38 at either end thereof, and identical to flange 36 for attachment thereto. The hollow electrical insulator element 39 includes a ceramic tube 41 which is soldered to flanges 38. A compressed O-ring made of vacuum-compatible elastomer 42 provides a high vacuum seal and is welded to flange 40 which is attached to lower flange 38.

Outside of the reaction chamber 1, the electrodes 20 can be attached by detachable members 22 to the power source 24 by means of wiring 26. Turning to the material of the heating filaments 15a and 15b themselves, as indicated above the filament comprises a superalloy. In particular, the specific nature of the superalloys such as Kanthal, Haynes and Inconell are set forth in Table 1 hereabove. The use of ceramic materials for the heating filaments 15a and 15b is not presently practical for such an application primarily due to the difficulties of obtaining and machining flat plates from such ceramic materials, such as silicon carbide and the like. There are also problems in providing reliable electrical contacts with such materials aside from the extremely high cost and low strength resulting in maintenance problems and the like.

Figure 5:
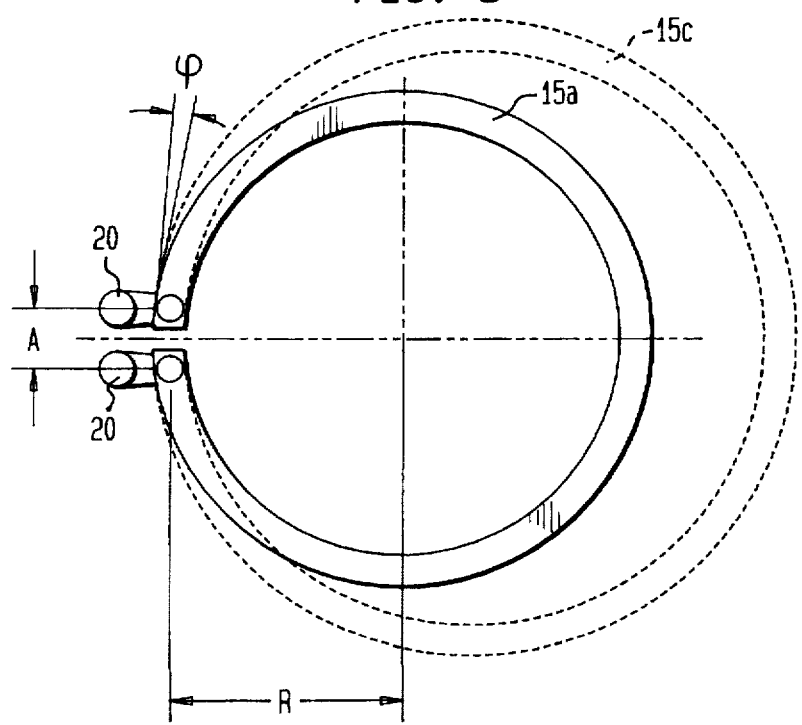
FIG. 5 is top, elevational, partially schematic view of a heating element for use in the reactor of the present invention.

As can be seen in FIGS. 1 and 2, the filaments 15a and 15b are mounted below the susceptor 9 in a manner which permits their thermal expansion without restriction. Referring to FIG. 5, for example, safilament 15 has a circular configuration, and the ends of the circle are separated by a small distance A.

Figure 3:
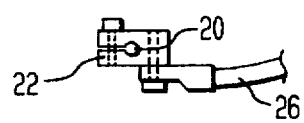
FIG. 3 is a bottom, elevational view of a portion of the reactor shown in FIG. 1, taken along line B—B thereof.

These ends are connected to electrodes 20, and thus the remaining portion of the circle is free to expand upon increasing temperatures. Thus, as shown by the interrupted line in FIG. 5, the filament 15a will expand considerably to the configuration shown as 15c, for example, under increased temperatures of about 1000° C. Any support for the bottom surface of the filament which would be required would be accomplished by utilizing ceramic and/or non-conductive members merely for support purposes, but again without permanent attachment and/or in any way preventing the thermal expansion shown in FIG. 5. The thermal expansion of the filament 15a (as well as that of filament 15b) is not restricted by the presence of the support elements 30 since they will restrict movement of the filaments only in the vertical direction. Furthermore, the connection between electrode 20 and cables 26, as particularly shown in FIG. 3, which are located outside of the reactor 1, are provided by commercially available electrical connections 22 (e.g., of the clamp type) rated by maximum current provided by power supplies 24a and 24b. Thus, in the embodiment shown in FIG. 5, the only restriction upon thermal expansion is at the point where the ends of the filaments 15 are connected to electrodes 20. In this manner, expansion occurs by rotation about these ends connected to electrodes 20. The angle of rotation thus effected by such thermal expansion is shown by angle φ shown in FIG. 5. This angle is proportional to the distance A between the two ends of the filament and between the electrodes 20, and can further be estimated from the following equation:

$$\phi = ASIN(A/R) - ASIN(A/R(1-\alpha t))$$

in which A is the distance between the electrodes (generally in the embodiment shown in FIG. 5 of about 0.5"), R is the average filament radius (in the embodiment shown in FIG. 5 about 3.5"), α is the coefficient of thermal expansion, and T is the filament temperature. Thus, in the case discussed above in which the superalloy Kanthal is employed, for example, having a coefficient of thermal expansion of 15e-6 1/C at a filament temperature of 1000° C., the angle φ will be about 0.070°. In order to fully compensate for this minor rotational movement, the electrodes 20 can be sealed within the reactor 1 at a distance separated from the filaments themselves.

Torque M required to twist electrode 20 on this angle (the same torque will be applied to the filament) can be calculated as:

$$M = GJ\phi/L, \text{ where} \tag{2}$$

G=10 E7 psi - torque module of elasticity.

J=1.57 R*4 polar moment of inertia, J=3.83 E-4 for electrode with 0.25" diameter.

L=20.0" - length of the electrode 20, see FIG. 1.

φ=0.07 degree - 1.22E-3 rad - torque angle calculated above.

Moment calculated by eq. 2 above equal only - 0.2 lb. In. So small a torque moment (achieved by using long electrode 20) will not damage filament 15a.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. Apparatus for the growth of epitaxial layers on a wafer comprising a chamber, a wafer carrier mounted within said chamber for mounting at least one of said wafers thereon, a reactant inlet for introducing a reactant for said epitaxial layer into said chamber, and heating means mounted within said chamber in juxtaposition with said wafer carrier for heating said wafer to a predetermined temperature for growing said epitaxial layer thereon, said heating means comprising at least one radiant heating element mounted with respect to said wafer carrier in a manner which permits unrestricted thermal expansion of said radiant heating element.

2. The apparatus of claim 1 including at least one electrode bonded to said at least one radiant heating element at a first location therein, wherein substantially said entire radiant heating element apart from said first location is free of any rigid attachment to an immovable surface which would prevent the thermal expansion thereof.

3. The apparatus of claim 1 wherein said radiant heating element comprises a superalloy.

4. The apparatus of claim 3 wherein said superalloy is selected from the group consisting of nickel and iron based superalloy compositions.

5. The apparatus of claim 1 wherein said wafer carrier comprises a rotatable disk mounted for rotation in a horizontal plane within said chamber.

6. The apparatus of claim 5 wherein said radiant heating element is mounted adjacent to said rotatable disk in a plane parallel to said horizontal plane thereof.

7. The apparatus of claim 6 wherein said radiant heating element comprises a circular filament in said plane.

8. The apparatus of claim 7 wherein said radiant heating filament comprises an interrupted circular configurations, comprising a first end and a second end defining said interruption therebetween.

9. The apparatus of claim 8 wherein said first and second ends of said interrupted circular configurations are permanently attached to electrodes for electrically connecting said radiant heating filament to a power source.

10. The apparatus of claim 9 wherein said electrodes extend outside of said chamber.

11. The apparatus of claim 10 including a detachable electrical connector for detachably connecting said electrodes to said power source outside of said chamber.

12. The apparatus of claim 1 wherein said heating means comprises a plurality of said radiant heating elements.

13. The apparatus of claim 12 wherein said wafer carrier comprises a rotatable disk mounted for rotation in a horizontal plane within said chamber, and wherein said plurality of said radiant heating elements are mounted adjacent to said rotatable disk in a plane parallel to said horizontal plane thereof.

14. The apparatus of claim 13 wherein said plurality of radiant heating elements comprise circular filaments in said plane.

15. The apparatus of claim 14 wherein said plurality of radiant heating filaments comprise interrupted circular configurations comprising a first end and a second end defining said interruption therebetween.

16. The apparatus of claim 15 wherein said first and second ends of said interrupted circular configurations are permanently attached to electrodes for electrically connecting said plurality of radiant heating filaments to a power source.

17. The apparatus of claim 16 wherein said electrodes extend outside of said chamber.

18. The apparatus of claim 17 including detachable electrical connectors for detachably connecting said electrodes to said power source outside of said chamber.

19. The apparatus of claim 1 wherein said radiant heating element comprises a metal having a coefficient of linear thermal expansion greater than about $10 \times 10^{-6}$.

20. The apparatus of claim 19 wherein said radiant heating element comprises a metal having a coefficient of linear thermal expansion greater than about $15 \times 10^{-6}$.

21. Apparatus for the growth of epitaxial layers on a wafer comprising a chamber, a wafer carrier mounted within said chamber for mounting at least one of said wafers thereon, a reactant inlet for introducing a reactant for said epitaxial layer into said chamber, and heating means mounted within said chamber in juxtaposition with said wafer carrier for heating said wafer to a predetermined temperature for growing said epitaxial layer thereon, said heating means comprising at least one radiant heating element mounted with respect to said wafer carrier, said radiant heating element including electrical connection means permanently affixed to said radiant heating element and extending outside of said chamber for connecting said radiant heating element to a power source, whereby said chamber is free of any removable electrical connections to said radiant heating element.

22. The apparatus of claim 21 wherein said electrical connection means comprises at least one electrode.

23. The apparatus of claim 21 wherein said radiant heating element and said electrical connection means comprise a superalloy.

24. The apparatus of claim 23 wherein said superalloy is selected from the group consisting of nickel and iron based superalloy compositions.

25. The apparatus of claim 21 wherein said wafer carrier comprises a rotatable disk mounted for rotation in a horizontal plane within said chamber.

26. The apparatus of claim 25 wherein said radiant heating element is mounted adjacent to said rotatable disk in a plane parallel to said horizontal plane thereof.

27. The apparatus of claim 26 wherein said radiant heating element comprises a circular element in said plane.

28. The apparatus of claim 27 wherein said radiant heating filament comprises an interrupted circular configuration comprising a first end and a second end defining said interruption therebetween.

29. The apparatus of claim 21 wherein said heating means comprises a plurality of said radiant heating elements.

* * * * *